United States Patent
Mason et al.

(10) Patent No.: US 11,966,303 B2
(45) Date of Patent: Apr. 23, 2024

(54) MEMORY SYSTEM FAILURE DETECTION AND SELF RECOVERY OF MEMORY DICE

(71) Applicant: Micron Technology, Inc., Boise, ID (US)

(72) Inventors: Robert Mason, Boise, ID (US); Scott A. Stoller, Boise, ID (US); Pitamber Shukla, Boise, ID (US); Kenneth W. Marr, Boise, ID (US); Chi Ming Chu, Boise, ID (US); Hossein Afkhami, Berkeley, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 15 days.

(21) Appl. No.: 17/877,779

(22) Filed: Jul. 29, 2022

(65) Prior Publication Data
US 2023/0393955 A1 Dec. 7, 2023

Related U.S. Application Data

(60) Provisional application No. 63/348,297, filed on Jun. 2, 2022.

(51) Int. Cl.
*G06F 11/14* (2006.01)
*G06F 9/30* (2018.01)

(52) U.S. Cl.
CPC ...... *G06F 11/1471* (2013.01); *G06F 9/30098* (2013.01); *G06F 11/1469* (2013.01)

(58) Field of Classification Search
CPC .................................................. G06F 11/1471
See application file for complete search history.

(56) References Cited

U.S. PATENT DOCUMENTS

| | | | | |
|---|---|---|---|---|
| 2003/0088805 A1* | 5/2003 | Majni | ................... | G06F 11/328 |
| | | | | 714/E11.034 |
| 2006/0075395 A1* | 4/2006 | Lee | ......................... | G06F 8/654 |
| | | | | 713/2 |
| 2008/0086631 A1* | 4/2008 | Chow | ..................... | G06F 8/654 |
| | | | | 711/E12.008 |
| 2009/0198857 A1* | 8/2009 | Pyeon | ...................... | G11C 8/12 |
| | | | | 711/E12.001 |
| 2013/0086328 A1* | 4/2013 | Frank | ................. | G06F 12/0813 |
| | | | | 711/125 |
| 2022/0246184 A1* | 8/2022 | Bhatia | .................... | H03K 19/21 |

* cited by examiner

*Primary Examiner* — Joseph D Torres

(74) *Attorney, Agent, or Firm* — NICHOLSON DE VOS WEBSTER & ELLIOTT LLP

(57) ABSTRACT

Exemplary methods, apparatuses, and systems including memory self-recovery management to correct failures due to soft-error rate events. The self-recovery manager detects a failure of a memory device. The self-recovery manager retrieves a set of register values from the memory device. The self-recovery manager stores the set of register values from the memory device. The self-recovery manager issues a reset command to the memory device, the reset command including generating a re-initialized set of register values. The self-recovery manager compares the set of register values with the re-initialized set of register values. The self-recovery manager triggering a self-recovery attempt using the comparison of the set of register values with the re-initialized set of register values.

20 Claims, 4 Drawing Sheets

MEMORY SYSTEM FAILURE DETECTION AND SELF RECOVERY OF MEMORY DICE

RELATED APPLICATION

This application claims priority to a provisional application entitled Memory System Failure Detection and Self Recovery of Memory Dice, U.S. Ser. No. 63/348,297, which is incorporated by reference herein in its entirety.

TECHNICAL FIELD

The present disclosure generally relates to failure detection of memory dice, and more specifically, relates to self-recovery of memory dice after failure detection.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
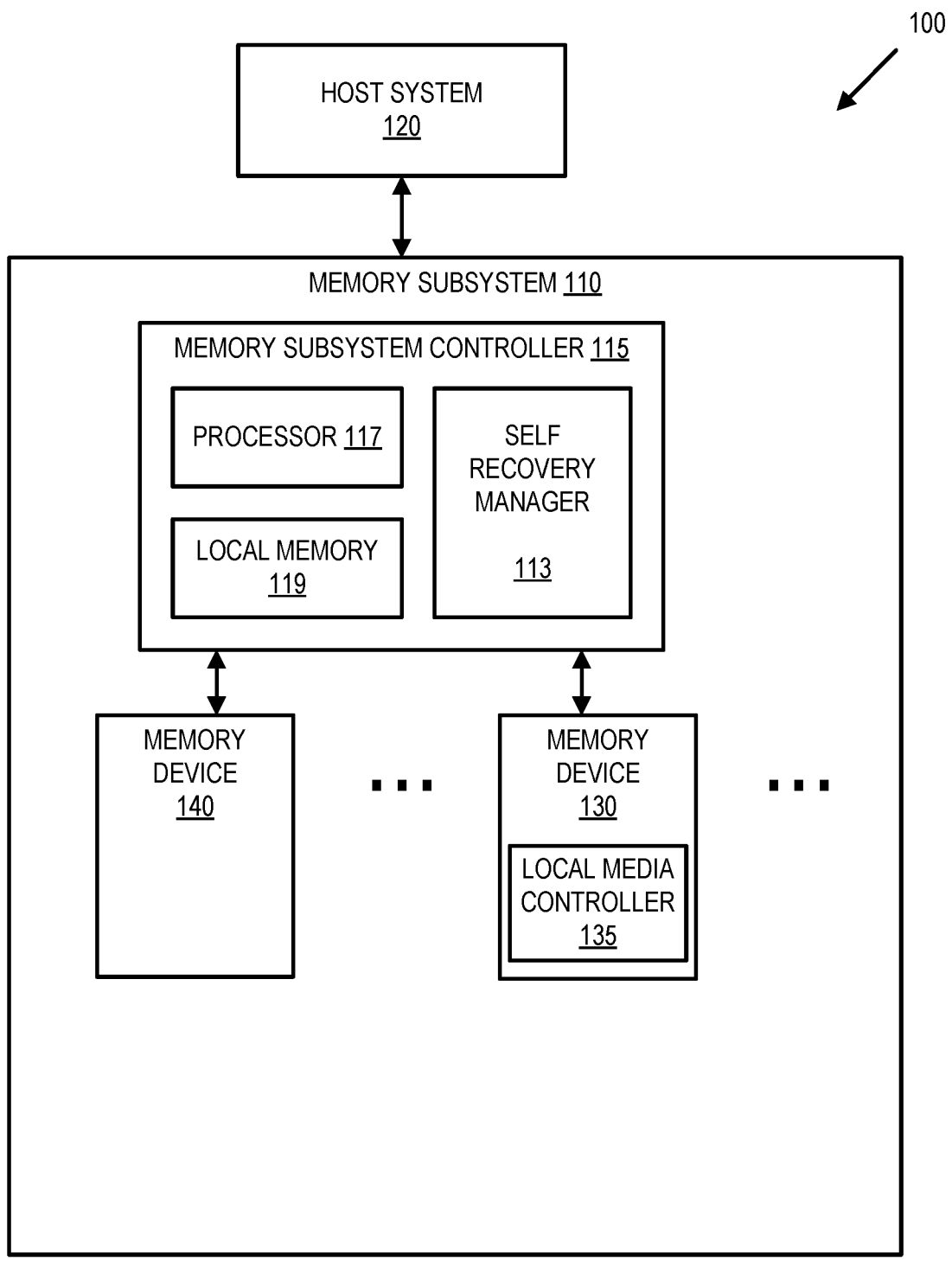
FIG. 1 illustrates an example computing system that includes a memory subsystem in accordance with some embodiments of the present disclosure.

Aspects of the present disclosure are directed to self-recovery of memory dice after failure detection in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Trim registers provide information about voltages used to program or access memory cells. For example, different voltages can be used when reading a given wordline depending, e.g., on the physical location of the wordline within a memory device. Current systems use various registers such as trim registers in a "set and forget" mode. This "set and forget" mode assumes that when the system sets a register value, the value will remain set until changed by the system. However, soft-error rate (SER) events (e.g., caused by background radiation, especially in smaller scale devices) can occur, causing various bits of these registers to flip. SER events leading to trim bit flips can result in random errors by modifying, e.g., the voltage values used to read memory cells. For some critical registers, such as trim registers, bit flips caused by SER events appear to the system as a failure due to a defective die. Traditional approaches of failure detection result in unnecessary performance issues such as poor QoS and die retirement.

Aspects of the present disclosure address the above and other deficiencies by adding checks based on the read-recovery rates on a per-die basis and block retirement events. For example, performing a reset by restoring register values such as power settings, throttle settings, trim settings, or other register values to power-on values after detecting a failure state. The register values prior to the failure state are compared to the power-on values to detect whether the failure is corrected by the reset. Applying this approach, it is possible to safeguard against SER errors on memory device products, reducing non-defect retirement events and therefore, enhancing the system yield. Aspects of the present disclosure further include a self-recovery process to determine the possibility of recovering values of a register where SER event corruption has occurred by setting the NAND back into a default state.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMNI controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130 and 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a self-recovery manager 113 that can trigger recovery of values of a register when an SER event corruption has occurred by issuing—a reset and reinitialization to reset one or more memory devices 130 to a default state. In some embodiments, the controller 115 includes at least a portion of the self-recovery manager 113. For example, the controller 115 can include a processor 117 (processing device) configured to execute instructions stored in local memory 119 for performing the operations described herein. In some embodiments, a self-recovery manager 113 is part of the host system 120, an application, or an operating system.

The self-recovery manager 113 identifies that a register value is erroneous because of an SER event and initiates a self-recovery process to prevent unnecessary retirement of a memory device 130. The self-recovery manager 113 can return the memory device 130 to normal service if the self-recovery process is successfully completed. For instance, the self-recovery manager 113 is configured to include at least two different failure recovery triggers to help identify and correct cases of possible register value corruption. A first failure recovery process includes an in-system trigger using recovery statistics such as a rate of grown bad blocks (GBBs) within a defined time interval, a number of computing operation failures, and/or a threshold time between failures. A second failure recovery trigger uses identification of memory device failure as an initialization. For example, the self-recovery manager receives an indication that a memory device 130 or a block has been marked for retirement when a threshold number of failures or rate of failures has been satisfied. For both of the failure recovery triggers, the self-recovery manager performs a register value verification flow to determine if the failure is correctable.

The self-recovery manager 113 is also configurable to initiate a self-recovery process if a measured rate of any failures of the memory device is greater than or otherwise satisfies an expected failure rate. For example, the self-recovery manager 113 initiates a self-recovery process for a memory device having a measured rate of failure is greater than a statistical estimate of failure rate attributable to manufacturing deviations. Further details with regards to the operations of the self-recovery manager 113 are described below.

Figure 2:
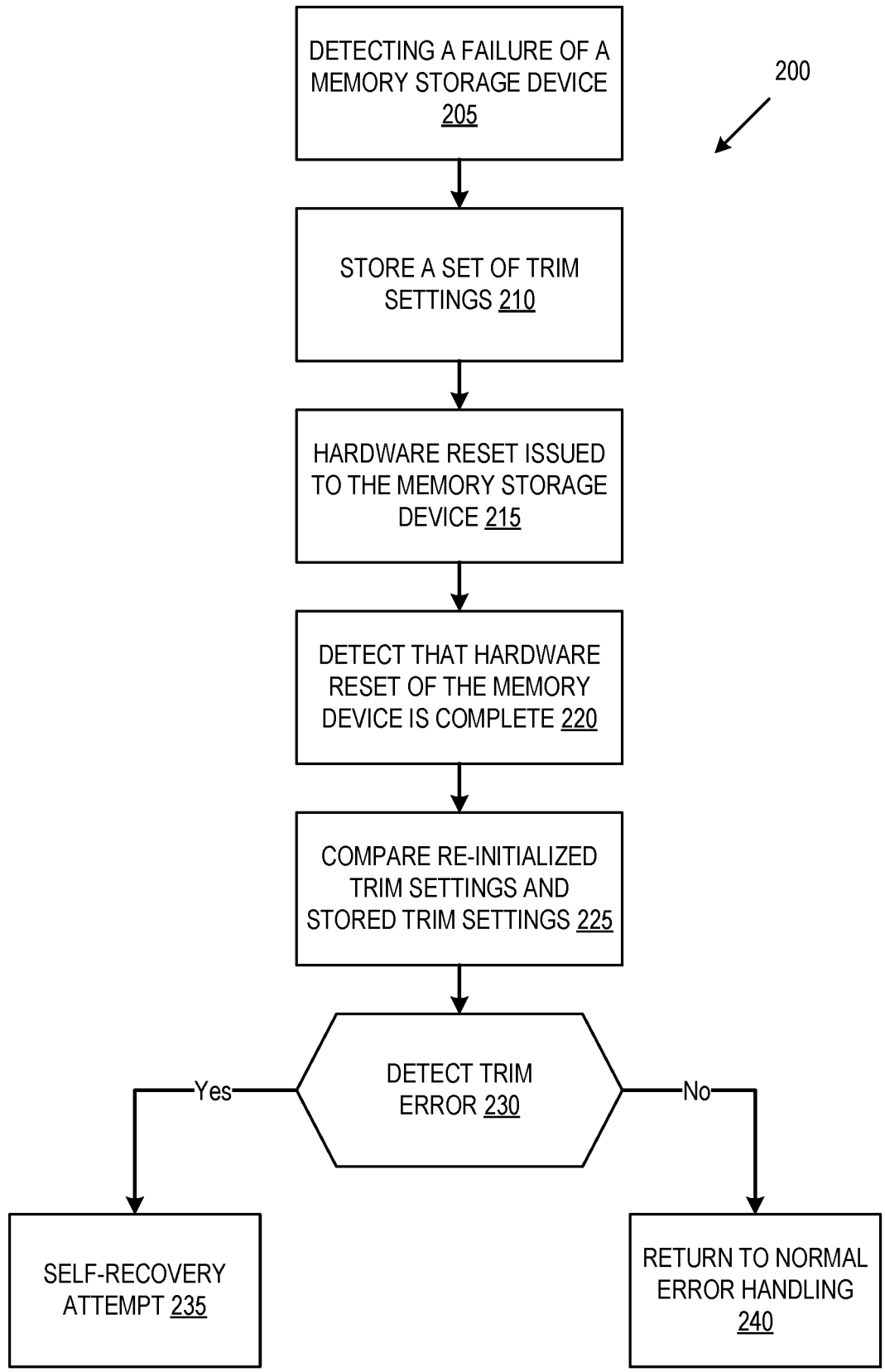
FIG. 2 is a flow diagram of a self-recovery process of a memory device in accordance with some embodiments of the present disclosure.

FIG. 2 illustrates a flow diagram of a self-recovery process 200 of a memory device in accordance with some embodiments of the present disclosure. While the operations of FIG. 2 are described with regard to trim registers, it should be appreciated that this is exemplary and not limiting. Built-in self test (BIST) circuitry could also be used to verify expected states of NAND-controller registers at a default state. Additionally, internally stored register values prior to the detected failure can also be used. Any register of the memory device can undergo self-recovery using the process described below. The process 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof.

In some embodiments, the process 200 is performed by the self-recovery manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the self-recovery manager detects a failure of a memory device or otherwise determines that the memory device has entered a firmware recovery mode. For instance, during memory operations on a memory device, an error may occur. An example of the error can include an error correcting code failure, a read retry failure, or a failure to respond to a host request. The self-recovery manager removes the memory device from host service to remove the risk of host data loss while the self-recovery manager determines whether the memory device can be recovered or if the defect is unrecoverable. In one embodiment, the memory device enters into firmware recovery mode when the self-recovery manager detects an indication of a retirement of one or more dice of the memory device.

In an example, a memory device includes one or more trim registers. During operation of the memory device, various forms of ambient radiation can cause some values of registers to be flipped and create an error. In some embodiments, the memory device first attempts recovery techniques such as read retry or applying error correcting codes. In cases where an SER event has occurred, these recovery techniques will fail to remediate the error and the self-recovery manager is activated or otherwise detects the failure of the recovery techniques.

In other embodiments, the self-recovery manager monitors a number of grown bad blocks and determines that a failure state exists when the number of grown bad blocks satisfies a threshold number or rate of grown bad blocks. Additionally, or alternatively, the self-recovery manager can compute other failure numbers/rates such as block retirements, read failures, or failures to respond to a host request.

For example, the self-recovery manager is configured to compare the failure rate with an expected failure rate due to manufacturing deviations of the memory device.

At operation 210, the self-recovery manager stores a set of trim settings. For example, the self-recovery manager retrieves the current set of trim settings from the memory device detected to have failed and writes the set of trim settings to a non-volatile memory location. In one embodiment, the self-recovery manager records a snapshot of the current set of trim settings at the time just prior to when the firmware recovery mode was entered. This snapshot of trim settings represents a failure state from which the self-recovery manager can identify when unexpected trim settings or erroneous trim settings can be corrected in the self-recovery process. For example, the snapshot of trim settings includes a combination of the power-on default settings and various modifications to the power-on default settings made during routine operation of the memory device.

At operation 215, the self-recovery manager issues a hardware reset to the memory device. For example, the self-recovery manager instructs the memory device to end all current operations and re-initializes the memory device to a default power-on state followed by the standard boot flow, such as the trim setting values corresponding to a power-on safe state. An example of settings corresponding to a power on safe state includes end user default settings, factory defined settings, manufacturer recommended settings, or a similar state prior to any runtime changes of the trim registers.

At operation 220, the self-recovery manager detects that the hardware reset of the memory device is complete. The self-recovery manager detects that the memory device has loaded a re-initialized set of trim settings and other register values after performing a power-off and a power-on cycle. For example, the self-recovery manager detects that trim settings have been re-initialized. The self-recovery manager may detect a change in the value of a program voltage, step-up voltage, pulse width, and other parameters for one or more pages, blocks, or partitions.

In some embodiments, the self-recovery manager identifies a previous set of trim settings that were stored during proper functioning of the memory device. The self-recovery manager can retrieve the previous set of trim settings as an alternative to performing a reset/power cycling operation. The previous set of trim settings can include any adjustments that were made after a reset/power cycling load of the trim settings and represents a last known safe set of trim settings prior to the failure detection. An example of the last known safe state of trim settings includes a set of trim settings that were modified from the power-on default settings but represent a set of settings during proper operations before the failure is detected.

At operation 225, the self-recovery manager compares the re-initialized trim settings with the trim settings that were stored at operation 210. For example, the self-recovery manager performs a bitwise comparison of the trim setting values from each of the re-initialized trim registers with a corresponding stored trim setting values from the trim registers prior to the reset to determine the number of mismatching bits. As discussed above, the re-initialized trim settings include trim values loaded during manufacturing of the memory device or a last known safe operating state.

At operation 230, the self-recovery manager determines whether a trim error is detected. For instance, using the bitwise comparison at operation 225, the self-recovery manager computes a difference between each re-initialized trim setting and the corresponding stored trim setting (e.g., as a number of mismatching bits). Using the difference, the self-recovery manager can identify if a trim setting was in an unexpected state (i.e., an unexpected value of the stored trim setting) at or just prior to the time of failure detection. In some cases, using the computed difference, the self-recovery manager determines that a trim setting was in an unexpected state at the time of failure if the computed difference satisfies a threshold number of mismatching bits. In response to detecting that the trim register was in the unexpected state, the flow proceeds to operation 235 to attempt self-recovery.

In other cases, using the computed difference, the self-recovery manager determines that the trim setting was not in an unexpected state if the computed difference does not satisfy a threshold number of mismatching bits. In response to determining that the failure was not due to a trim setting, the self-recovery manager determines that the failure is not from an SER event at a trim register, but from another location (e.g., somewhere in a data path). In these cases, the self-recovery manager returns the memory device to the regular error handling flow. In these examples, the flow proceeds to operation 240.

At operation 235, the self-recovery manager loads the re-initialized trim setting into the corresponding location in memory to replace the unexpected trim setting. The self-recovery manager performs one or more test reads or writes to validate that the re-initialized trim setting has corrected the failure state and no additional failures are detected. For example, the self-recovery manager can reattempt one or more read operations that triggered the failure detected at operation 205. If the one or more read operations that previously failed are successful, then the self-recovery manager can determine that the errors have been corrected. In some embodiments, the self-recovery manager evaluates one or more GBBs that occurred prior to entering firmware recovery to determine if the GBBs can also be returned to user service and were not caused by a true defect. In some embodiments, the self-recovery manager can return the locations of the failure to normal service after re-initialization and retire the locations if an additional failure is detected.

At operation 240, the self-recovery manager terminates the self-recovery process and returns the memory operations to normal error handling. For instance, the self-recovery manager determines that the failure is not correctable using the self-recovery process and indicates that the die or block is retired due to an uncorrectable failure. In some embodiments, after terminating the self-recovery attempt, the self-recovery manager determines the status of the memory device is a failure state.

While the operations above are described with reference to the example of trim settings, method 200 applies to detecting failures of other types. For example, an SER event can lead to altering values of memory subsystem firmware or other stored values that can be re-initialized.

Figure 3:
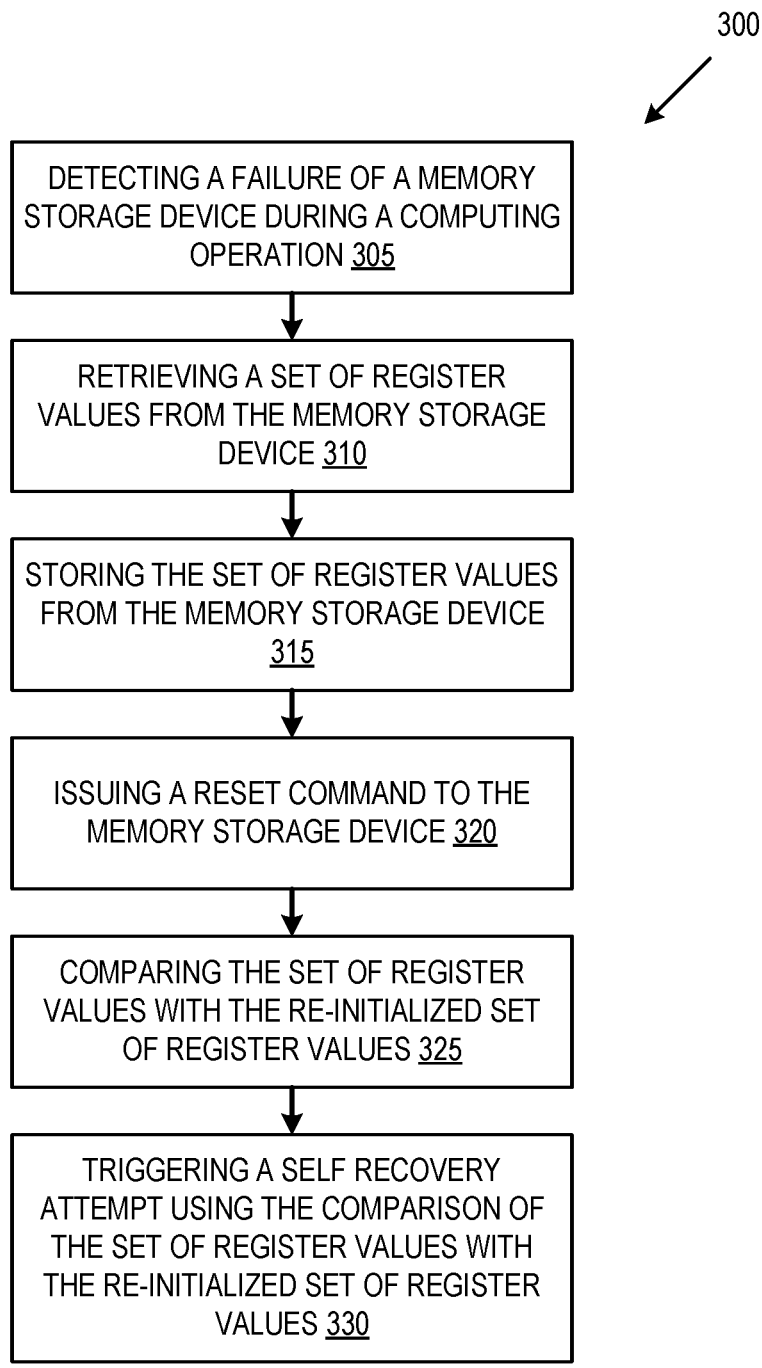
FIG. 3 is a flow diagram of an example method to trigger a self-recovery attempt of a memory device, in accordance with some embodiments of the present disclosure.

FIG. 3 is a flow diagram of an example method 300 to trigger a self-recovery attempt of a memory device, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the self-recovery manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the self-recovery manager detects a failure of a memory device. As described above with regard to operation 205, the self-recovery manager detects an error correcting code failure, a read retry failure, or a failure to respond to a host request. The memory device enters a recovery mode to remove the memory device from host service while the self-recovery manager performs a self-recovery process to determine whether the failure is recoverable or unrecoverable.

At operation 310, the self-recovery manager retrieves a set of register values from the memory device. As described above with regard to operation 210, the self-recovery manager accesses one or more registers of the memory device (e.g., trim, I/O registers, etc.) to store in a non-volatile memory location during the self-recovery process.

At operation 315, the self-recovery manager stores the set of register values from the memory device. As described above with regard to operation 210, the self-recovery manager stores the values of one or more registers in a non-volatile memory location during the self-recovery process.

At operation 320, the self-recovery manager issues a reset command to the memory device. As described above with regard to operation 215, the self-recovery manager restarts the memory device to refresh all registers to the power-on safe state values. In some embodiments, the flow remains at operation 320 until the self-recovery manager detects that the reset of the memory device is complete.

At operation 325, the processing device compares the set of register values with the re-initialized set of register values. As described above with regard to operation 225, the self-recovery manager performs a comparison of the set of register values that are stored in the non-volatile memory location and the re-initialized registers that result from completion of the reset command. In some examples, the comparison can be bitwise or register-wise to determine a difference between the stored register values and the re-initialized register values.

At operation 330, the self-recovery manager triggers a self-recovery attempt using the comparison of the set of register values with the re-initialized set of register values. As described with regards to operations 230 and 235 the self-recovery manager triggers an attempted self-recovery after determining that one or more of the registers was in an unexpected state or otherwise had a correctable error. In some examples, the self-recovery manager determines that the set of register values has an unexpected state because one or more bit differences exist between the stored set of register values and the re-initialized set of register values. In this case, the re-initialized set of register values corrects the operating state which resolves the cause of the failure.

Figure 4:
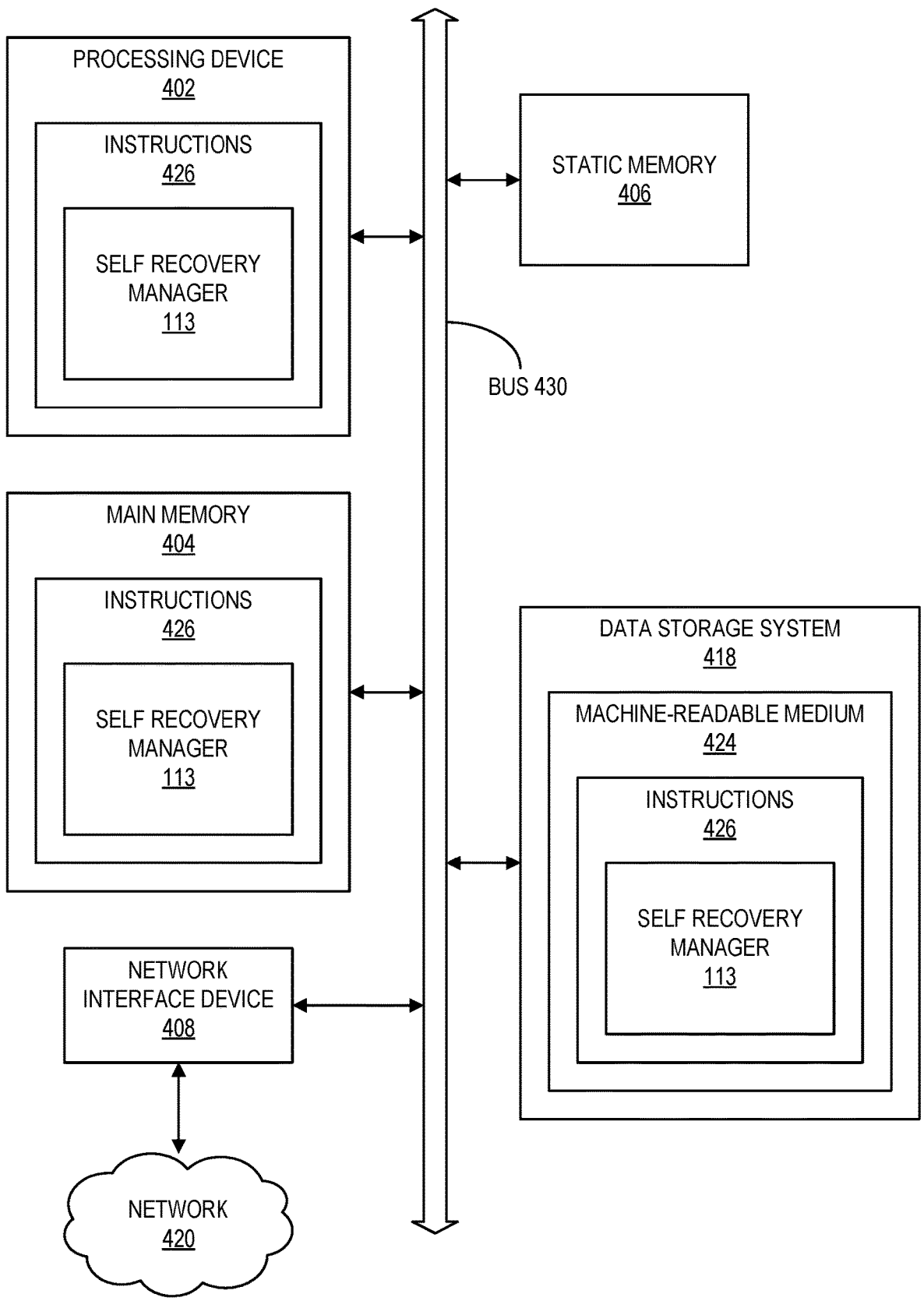
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the self-recovery manager 113 of FIG. 1). In alternative embodiments, the machine can be connected (e.g., networked) to other machines in a LAN, an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory subsystem 110 of FIG. 1.

In one embodiment, the instructions 426 include instructions to implement functionality corresponding to a self-recovery manager (e.g., the self-recovery manager 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work most effectively to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200 or 300 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method of error recovery, the method comprising:
   detecting a failure of a memory device;
   retrieving a set of register values from the memory device;
   storing the set of register values from the memory device;
   issuing a reset command to the memory device, wherein the reset command includes generating a re-initialized set of register values;
   comparing the set of register values with the re-initialized set of register values; and
   triggering a self-recovery attempt using the comparison of the set of register values with the re-initialized set of register values.

2. The method of claim 1, wherein detecting the failure comprises detecting an indication of a retirement of one or more dice of the memory device.

3. The method of claim 1, wherein the reset command includes a power cycling, and wherein the re-initialized set of register values correspond to a default value stored in a non-volatile storage location.

4. The method of claim 1 further comprising:
   identifying, based on the comparison of the set of register values with the re-initialized set of register values, that the set of register values represents an unexpected state;
   recovering, in response to identifying the unexpected state, from the unexpected state using the re-initialized set of register values; and
   determining, in response to recovering from the unexpected state, a status of the memory device.

5. The method of claim 1, wherein detecting the failure of the memory device comprises identifying a number of grown bad blocks over a time interval satisfies a threshold rate of grown bad blocks.

6. The method of claim 1, wherein detecting the failure of the memory device comprises:
   computing a rate of failures of the memory device;
   comparing the rate of failures with an expected failure rate of the memory device, wherein the expected failure rate is a statistical estimate of manufacturing deviation; and
   determining a failure state when the rate of failures is greater than the expected failure rate.

7. The method of claim 1, wherein triggering a self-recovery attempt using the comparison of the set of register values with the re-initialized set of register values comprises:
   computing a difference of the set of register values and the re-initialized set of register values;

determining that the difference satisfies a threshold; and in response to determining that the difference satisfies a threshold, triggering a self-recovery attempt.

8. The method of claim 7, further comprising:

determining that the difference does not satisfy a threshold; and in response to determining that the difference does not satisfy a threshold, resuming normal error handling.

9. A non-transitory computer-readable storage medium comprising instructions that, when executed by a processing device, cause the processing device to:

detect a failure of a memory device;

retrieve a set of trim values from the memory device;

store the set of trim values in a non-volatile memory location;

issue a reset command to the memory device, wherein the reset command includes generating a re-initialized set of trim values;

compare the set of trim values with the re-initialized set of trim values; and trigger a self-recovery attempt using the comparison of the set of trim values with the re-initialized set of trim values.

10. The non-transitory computer-readable storage medium of claim 9, wherein the instructions that cause the processing device to detect the failure comprise instructions that, when executed by a processing device, cause the processing device to detect an indication of a retirement of one or more dice of the memory device.

11. The non-transitory computer-readable storage medium of claim 9, wherein the reset command includes a power cycling, and wherein the re-initialized set of trim values are a set of default values stored in a non-volatile storage location.

12. The non-transitory computer-readable storage medium of claim 9, the instructions further causing the processing device to:

identify, using the comparison of the set of trim values with the re-initialized set of trim values, that the set of trim values represents an unexpected state;

recover from the unexpected state using the re-initialized set of trim values; and determine, in response to recovering from the unexpected state, a status of the memory device.

13. The non-transitory computer-readable storage medium of claim 9, wherein the instructions that cause the processing device to detect the failure of the memory device comprise instructions that, when executed by a processing device, cause the processing device to identify a number of grown bad blocks over a time interval satisfies a threshold rate of grown bad blocks.

14. The non-transitory computer-readable storage medium of claim 9, wherein the instructions that cause the processing device to detect the failure of the memory device comprise instructions that, when executed by a processing device, cause the processing device to:

compute a rate of failures of the memory device;

compare the rate of failures with an expected failure rate of the memory device, wherein the expected failure rate is a statistical estimate of manufacturing deviation; and determine a failure state when the rate of failures is greater than the expected failure rate.

15. The non-transitory computer-readable storage medium of claim 9, wherein the instructions that cause the processing device to trigger a self-recovery attempt using the comparison of the set of trim values with the re-initialized set of trim values comprise instructions that, when executed by a processing device, cause the processing device to:

compute a difference of the set of trim values and the re-initialized set of trim values;

determine that the difference satisfies a threshold; and in response to determining that the difference satisfies a threshold, trigger a self-recovery attempt.

16. A system comprising:

a plurality of memory devices; and a processing device, operatively coupled with the plurality of memory devices, to:

detect a failure of a memory device;

retrieve a set of trim values from the memory device;

store the set of trim values from the memory device;

issue a reset command to the memory device, wherein the reset command includes generating a re-initialized set of trim values;

compare the set of trim values with the re-initialized set of trim values; and trigger a self-recovery attempt using the comparison of the set of trim values with the re-initialized set of trim values, wherein triggering the self-recovery attempt comprises:

computing a difference of the set of register values and the re-initialized set of register values;

determining that the difference satisfies a threshold; and in response to determining that the difference satisfies a threshold, triggering a self-recovery attempt.

17. The system of claim 16, the processing device, operatively coupled with the plurality of memory devices, further to detect an indication of a retirement of one or more dice of the memory device.

18. The system of claim 16, wherein the reset command includes a power cycling, and wherein the re-initialized set of trim values correspond to a set of default values.

19. The system of claim 16, the processing device, operatively coupled with the plurality of memory devices, further to:

identify, based on the comparison of the set of trim values with the re-initialized set of trim values, that the set of trim values represents an unexpected state;

recover from the unexpected state using the re-initialized set of trim values; and determine, in response to recovering from the unexpected state, a status of the memory device.

20. The system of claim 16, the processing device, operatively coupled with the plurality of memory devices, further to:

compute a rate of failures of the memory device;

compare the rate of failures with an expected failure rate of the memory device, wherein the expected failure rate is a statistical estimate of manufacturing deviation; and determine a failure state when the rate of failures is greater than the expected failure rate.

* * * * *